(12) United States Patent
Lee et al.

(10) Patent No.: US 8,441,018 B2
(45) Date of Patent: May 14, 2013

(54) DIRECT BANDGAP SUBSTRATES AND METHODS OF MAKING AND USING

(75) Inventors: Vincent Wing-Ho Lee, Kendall Park, NJ (US); Ioannis Kymissis, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 267 days.

(21) Appl. No.: 12/706,502

(22) Filed: Feb. 16, 2010

(65) Prior Publication Data

US 2010/0213467 A1  Aug. 26, 2010

Related U.S. Application Data

(63) Continuation-in-part of application No. PCT/US2008/009767, filed on Aug. 15, 2008.

(60) Provisional application No. 60/964,935, filed on Aug. 16, 2007, provisional application No. 61/230,960, filed on Aug. 3, 2009.

(51) Int. Cl.
   *H01L 27/15* (2006.01)
(52) U.S. Cl.
   USPC ............... 257/79; 257/75; 257/89; 257/98; 257/E33.003; 257/E21.09; 438/29; 438/479; 438/486
(58) Field of Classification Search ............ 257/79
   See application file for complete search history.

(56) References Cited

U.S. PATENT DOCUMENTS

| | | | |
|---|---|---|---|
| 5,399,885 A | | 3/1995 | Thijs et al. |
| 5,539,763 A | * | 7/1996 | Takemi et al. ............ 372/50.1 |
| 5,789,766 A | | 8/1998 | Huang et al. |
| 5,858,819 A | * | 1/1999 | Miyasaka ............... 438/149 |
| 5,910,706 A | * | 6/1999 | Stevens et al. ............ 313/498 |

(Continued)

FOREIGN PATENT DOCUMENTS

| | | | |
|---|---|---|---|
| JP | 05236484 | * | 9/1993 |
| WO | WO-2009/023263 A1 | | 2/2009 |

OTHER PUBLICATIONS

"International Application Serial No. PCT/US 08/09767, International Search Report mailed Nov. 3, 2008", 2 pgs.

(Continued)

*Primary Examiner* — N Drew Richards
*Assistant Examiner* — Ankush Singal
(74) *Attorney, Agent, or Firm* — Schwegman Lundberg Woessner P.A.

(57) ABSTRACT

An indirect bandgap thin film semiconductor circuit can be combined with a compound semiconductor LED such as to provide an active matrix LED array that can have high luminous capabilities such as for a light projector application. In another example, a highly efficient optical detector is achievable through the combination of indirect and direct bandgap semiconductors. Applications can include display technologies, light detection, MEMS, chemical sensors, or piezoelectric systems. An LED array can provide structured illumination, such as for a light and pattern source for projection displays, such as without requiring spatial light modulation (SLM). An example can combine light from separate monolithic light projector chips, such as providing different component colors. An example can provide full color from a single monolithic light projector chip, such as including selectively deposited phosphors, such as to contribute individual component colors to an overall color of a pixel.

22 Claims, 11 Drawing Sheets

U.S. PATENT DOCUMENTS

| | | | |
|---|---|---|---|
| 5,977,565 A * | 11/1999 | Ishikawa et al. | 257/81 |
| 6,054,734 A * | 4/2000 | Aozasa et al. | 257/315 |
| 6,091,127 A * | 7/2000 | Chandra et al. | 257/442 |
| 6,134,368 A * | 10/2000 | Sakata | 385/131 |
| 6,340,830 B1 * | 1/2002 | Takemura | 257/350 |
| 6,475,872 B1 * | 11/2002 | Jung | 438/384 |
| 6,483,127 B2 * | 11/2002 | Saeki | 257/96 |
| 6,486,437 B2 * | 11/2002 | Tanabe | 219/121.86 |
| 6,746,903 B2 * | 6/2004 | Miyasaka | 438/149 |
| 6,757,499 B1 * | 6/2004 | Aoki | 398/182 |
| 6,807,214 B2 * | 10/2004 | Corzine et al. | 372/50.1 |
| 6,893,889 B2 * | 5/2005 | Park et al. | 438/22 |
| 6,936,859 B1 * | 8/2005 | Uemura et al. | 257/99 |
| 6,943,500 B2 | 9/2005 | LeChevalier | |
| 6,949,422 B2 * | 9/2005 | Kim | 438/166 |
| 6,958,792 B2 * | 10/2005 | Lan et al. | 349/110 |
| 7,019,330 B2 * | 3/2006 | Ludowise | 257/79 |
| 7,037,742 B2 * | 5/2006 | Slater et al. | 438/39 |
| 7,049,635 B2 * | 5/2006 | Sano et al. | 257/79 |
| 7,095,465 B2 * | 8/2006 | Lin | 349/113 |
| 7,112,462 B2 * | 9/2006 | Arai et al. | 438/46 |
| 7,180,236 B2 * | 2/2007 | Koo et al. | 313/499 |
| 7,411,221 B2 * | 8/2008 | Cho et al. | 257/79 |
| 7,645,646 B2 * | 1/2010 | Young | 438/145 |
| 7,687,821 B2 * | 3/2010 | Jeon et al. | 257/99 |
| 7,776,669 B2 * | 8/2010 | Ahn | 438/166 |
| 7,833,904 B2 * | 11/2010 | Tang et al. | 438/669 |
| 7,919,777 B2 * | 4/2011 | Lim et al. | 257/61 |
| 7,989,812 B2 * | 8/2011 | Yamazaki et al. | 257/72 |
| 8,049,229 B2 * | 11/2011 | Yoon | 257/88 |
| 2002/0013114 A1 * | 1/2002 | Ohtani et al. | 445/23 |
| 2002/0024053 A1 * | 2/2002 | Inoue et al. | 257/79 |
| 2002/0047580 A1 * | 4/2002 | Kunii et al. | 315/169.3 |
| 2002/0074558 A1 * | 6/2002 | Hata et al. | 257/89 |
| 2002/0081773 A1 * | 6/2002 | Inoue et al. | 438/108 |
| 2003/0026310 A1 * | 2/2003 | Valliath | 372/50 |
| 2003/0042397 A1 * | 3/2003 | Tatsuki et al. | 250/200 |
| 2003/0113949 A1 * | 6/2003 | Valliath | 438/46 |
| 2003/0148565 A1 * | 8/2003 | Yamanaka | 438/200 |
| 2003/0206332 A1 * | 11/2003 | Yamazaki et al. | 359/312 |
| 2003/0209710 A1 * | 11/2003 | Yamazaki et al. | 257/66 |
| 2004/0169786 A1 * | 9/2004 | Yamazaki et al. | 349/61 |
| 2004/0211968 A1 * | 10/2004 | Lin et al. | 257/81 |
| 2004/0224453 A1 * | 11/2004 | Hatano et al. | 438/199 |
| 2004/0259282 A1 * | 12/2004 | Oohata | 438/34 |
| 2005/0042788 A1 * | 2/2005 | Ueda | 438/46 |
| 2005/0051786 A1 * | 3/2005 | Okazaki et al. | 257/98 |
| 2005/0062049 A1 * | 3/2005 | Lin et al. | 257/79 |
| 2005/0139151 A1 * | 6/2005 | Jung | 117/200 |
| 2005/0208710 A1 * | 9/2005 | Isobe et al. | 438/149 |
| 2005/0270406 A1 * | 12/2005 | Fukunaga et al. | 348/342 |
| 2006/0024981 A1 * | 2/2006 | Nakamura et al. | 438/795 |
| 2006/0027809 A1 * | 2/2006 | Ogawa et al. | 257/66 |
| 2006/0128045 A1 | 6/2006 | Hsu et al. | |
| 2006/0157714 A1 * | 7/2006 | Yoo et al. | 257/79 |
| 2006/0177361 A1 * | 8/2006 | Kumomi | 422/245.1 |
| 2006/0180818 A1 * | 8/2006 | Nagai et al. | 257/89 |
| 2006/0252237 A1 * | 11/2006 | Hartzell | 438/487 |
| 2006/0267491 A1 | 11/2006 | Koo et al. | |
| 2007/0030611 A1 * | 2/2007 | Cho et al. | 361/58 |
| 2007/0042518 A1 | 2/2007 | Chen | |
| 2007/0099352 A1 * | 5/2007 | Ro et al. | 438/149 |
| 2007/0187676 A1 * | 8/2007 | Park et al. | 257/40 |
| 2007/0200128 A1 * | 8/2007 | Yano | 257/99 |
| 2007/0241427 A1 * | 10/2007 | Mochizuki et al. | 257/586 |
| 2007/0291325 A1 * | 12/2007 | Toyota et al. | 358/474 |
| 2008/0023716 A1 * | 1/2008 | Sagimori et al. | 257/98 |
| 2008/0047599 A1 * | 2/2008 | Buller et al. | 136/251 |
| 2008/0239253 A1 * | 10/2008 | Liu et al. | 353/102 |

OTHER PUBLICATIONS

"International Application Serial No. PCT/US 08/09767, Written Opinion mailed Nov. 3, 2008", 7 pgs.

* cited by examiner

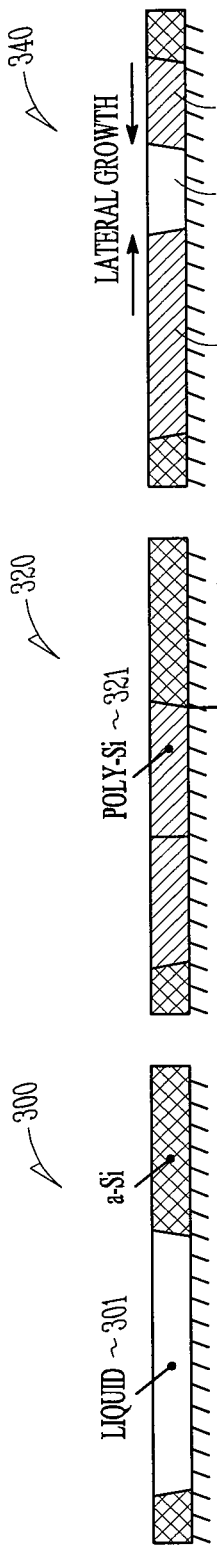
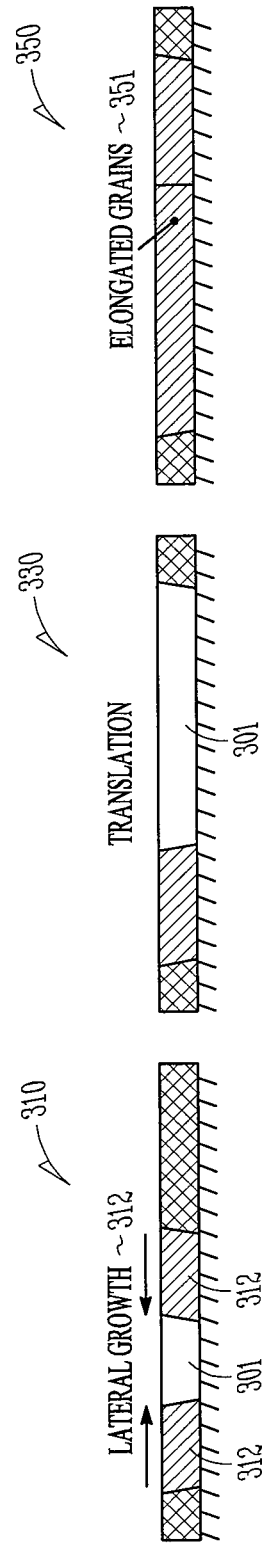
FIG. 3A  FIG. 3C  FIG. 3E
FIG. 3B  FIG. 3D  FIG. 3F

SLS 300-400 cm²/(Vs)

"2-SHOT" SLS 200-300 cm²/(Vs)

DIRECT BANDGAP SUBSTRATES AND METHODS OF MAKING AND USING

CLAIM OF PRIORITY

This patent application is a continuation-in-part of, and claims the benefit of priority of, Kymissis et al. PCT Application PCT/US2008/009767, entitled "DIRECT BANDGAP SUBSTRATE WITH SILICON THIN FILM CIRCUITRY," filed on Aug. 15, 2008, through which, in turn, the present application claims the benefit of priority of Kymissis U.S. Provisional Patent Application Ser. No. 60/964,935, entitled "ACTIVE MATRIX LED LIGHT ENGINE," filed on Aug. 16, 2007, both of which are incorporated herein by reference in their entireties.

This patent application also claims the benefit of priority of Kymissis et al. U.S. Provisional Patent Application Serial Number 61/230,960, entitled A "DIRECTLY-ADDRESSED MONOLITHIC LED ARRAY AS A PROJECTION SOURCE," filed on Aug. 3, 2009, which is incorporated herein by reference in its entirety.

STATEMENT REGARDING FEDERALLY SPONSORED RESEARCH OR DEVELOPMENT

This invention was made with government support under award number ECCS-0644656 from the National Science Foundation (NSF). The government has certain rights in this invention.

BACKGROUND

Light emitting diodes (LEDs) have luminous efficiencies that surpass virtually all other light sources. As a consequence, discrete LEDs can be applied to a range of applications in which illumination is desired.

A substantially direct energy band gap material can provide more efficient light emission and absorption than indirect gap materials, such as silicon. In an example, a substantially direct energy band gap material can include a compound semiconductor material. A compound semiconductor includes semiconductor elements drawn from different groups of the periodic table of elements, e.g., Groups II, III, V, and VI. Compound semiconductors can provide desired capabilities of a more substantially direct energy band gap than non-compound semiconductors, which have more indirect energy band gap properties.

OVERVIEW

This document discusses, among other things, a process that can combine a compound semiconductor or other direct band gap substrate with thin film semiconductor circuitry, which can have an indirect band gap. The thin film circuitry can include a thin film transistor, which can include a field effect transistor (FET). The thin film FET can be made by forming a thin film of a semiconductor active layer, a dielectric layer, and conductive contacts upon a supporting substrate. The thin film semiconductor layer can be silicon-based, and can include amorphous silicon, microcrystalline silicon, or annealed polycrystalline silicon. In an example, thin film devices can be made using an organic material or an amorphous film of a metal oxide with semiconducting behavior, e.g., ZnO or its alloys.

In an example, an active matrix LED array that can exhibit high luminous capabilities can be realized with the describe processes. In another example, a highly efficient optical detector is achievable through the combination described. The described structure can greatly enhance any application that uses functional substrates and can benefit from a high quality circuit layer, including but not limited to display technologies, light detection, MEMS, chemical sensors, and piezoelectric system.

This document also describes, among other things, a directly-addressed segmented monolithically integrated LED array, such as with an optical power density of $0.69 \text{ W/cm}^2$, in an example, capable of projecting an image with 100,000 $\text{cd/m}^2$ through a 10× microscope objective. This document also describes using LED arrays for projection and examples of schemes for making full color projectors such as from three LED arrays. These LED arrays can either be actively addressed with transistors (e.g., recrystallized Si thin film transistors) at each pixel, passively addressed, or directly-addressed, in certain examples. The technology described herein can integrate both a light source and a light modulator into the same component, in an example. Since light need only be generated when needed, this technology can provide higher efficiencies and lower power consumption in a smaller form factor than certain other approaches. This technology can be used for light projection, such as for image display, or for mask-free lithography such as by using a UV LED substrate, in an example.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 3A-3F illustrate an example of a sequential lateral solidification (SLS) technique.

DETAILED DESCRIPTION

In semiconductor processing, processing substrates with substantially direct band gaps (e.g., GaAs, etc.) presents different challenges and advantages than silicon processing. A substantially direct energy gap can provide for more efficient light emission and absorption than a silicon semiconductor. However, silicon semiconductor processing provides well-established techniques that are useful for fabricating complex integrated circuits for many different functions. Bulk silicon semiconductor processing techniques can be difficult to combine with processing techniques for substrates with direct band gaps for a number of reasons, including thermal budget and heteroepitaxy limitations.

I. Examples of Thin-Film Indirect Bandgap Semiconductor on Compound Semiconductor However, the present inventors have recognized that another useful process permits fabricating circuitry using a thin film of an indirect bandgap semiconductor, such as silicon. More particularly, sequential lateral solidification (SLS) permits fabricating high-quality circuitry on virtually any substrate, including a glass sheet substrate or an organic substrate. The SLS process can provide silicon re-crystallization, such that no crystallographic templating on the substrate is required, the thermal load on the substrate can be minimal, and the resulting re-crystallized crystal quality can be higher than non-SLS techniques and can produce higher quality transistors.

The present inventors have recognized, among other things, that marrying a substantially direct band gap substrate, such as a compound semiconductor, with SLS thin film transistor technology using an indirect bandgap semiconductor, such as silicon, can be used to make highly efficient devices, such as, for example, an active matrix LED array. Other approaches of integrating a direct band gap substrate and silicon circuitry to form a heterogeneous device can be difficult. Such other approaches of combining a direct band gap substrate and silicon can include shape self-assembly, wafer bonding, or magnetic retention. However, such other approaches can suffer from impediments such as poor bonding, due to limited thermal budgets or mismatched coefficients of thermal expansion between the two different types of materials. Substrates with substantially direct band gaps, such as compound semiconductors, can be very sensitive to thermal (heat-intensive) semiconductor processing techniques. Another challenge in obtaining a hybrid silicon/non-silicon device is in locally interconnecting the non-silicon substrate with the silicon device to which it abuts.

Figure 1:
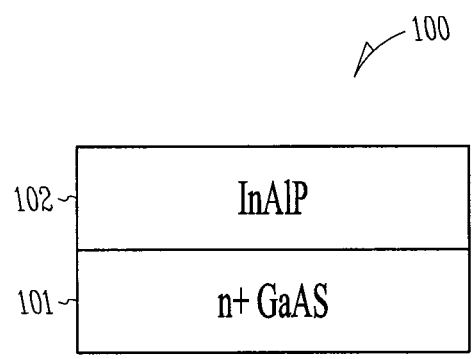
FIG. 1 illustrates an example of a GaAs/InAlP compound semiconductor.

As stated, a substrate with a direct band gap can provide unique properties. In an example, as shown in FIG. 1, an inorganic substrate with this property can be used as an inorganic light emitting diode (LED) 100. In an example, a substrate can be formed, such as a GaAs/InAlP wafer. In an example, an n+ GaAs cathode 101 cathode can be combined with an InAlP anode 102 to form an LED 100 structure.

An inorganic LED can provide luminous efficiency that far surpasses many other light sources. In an example, the internal quantum efficiency of a compound semiconductor LED can be close to 100%. In an example, a range of output wavelengths from infrared (IR) to ultraviolet (UV) of saturated colors can also be provided. In addition, the lifetime of an inorganic LED device can be in the tens of thousands of hours, in an example.

Figure 2:
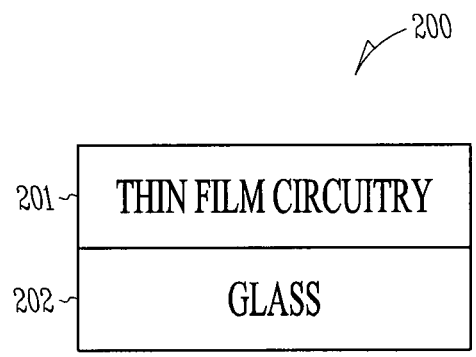
FIG. 2 illustrates an example of components used to create an LCD device using thin film circuitry.

The present inventors have recognized, among other things, that thin film transistor technology can allow a field effect transistor (FET) to be made, such as by depositing or otherwise forming a thin film of a semiconductor active layer over a supporting substrate. In an example, the formed thin film of semiconductor can include an indirect bandgap semiconductor, such as silicon, or an organic semiconductor. Unlike a bulk silicon semiconductor wafer process, a thin film transistor can be deposited or otherwise formed on more diverse types of substrates. For example, thin film circuitry 201 can be placed on a glass substrate 202, such as shown in the example of FIG. 2, such as for use in an LCD display 200. The thin film circuitry 201 that is used for the LCD process can be deposited on top of a glass substrate 202.

In an example, the thin film silicon can be manipulated or tailored, such as to exploit its semiconductor properties. The thin-film semiconductor layer can be formed as or converted into amorphous silicon, microcrystalline silicon, or it can be laser annealed into polysilicon. In an example, a sequential lateral solidification (SLS) technique can be used to laser anneal the thin film silicon such that it can be used to provide good quality thin film circuitry.

In an example, the SLS can include a thin-film pulsed-laser crystallization technique (where such "crystallization" can refer to or include "recrystallization"). In an example, SLS can be used to create one or a variety of polycrystalline microstructures, such as by using different thin-film materials, different substrates, or different pulsed-laser sources. SLS can use a narrow energy-density window in laser crystallization of the Si thin film. The laser can melt the film and form a long "super-lateral growth" (SLG) of low-defect-density crystals.

In an example, the SLG can be controlled, such as by inducing localized complete melting of the film. SLG can also include iterative translation and re-irradiation, which can provide even more accurate control of the microstructure of the material.

FIGS. 3A-3F describe an example of SLS. At 300, a selected region of thin film silicon is melted, transforming the selected region into liquid 301. At 310, the liquid 301 re-crystallizes into lateral growth regions 312. At 320, this eventually results in a selective polysilicon region 321. Such techniques can be iteratively applied, such as to obtain translation of the liquid region 301 at 330, further lateral growth at 340, and ultimately the creation of elongated polysilicon grains 351, such as at 350. The formation of elongated polysilicon grains 351 allows the resulting material to be used for a high-mobility and a low-threshold-voltage transistor device. The SLS process can be performed on a silicon or other indirect bandgap semiconductor thin film that has been formed on a direct bandgap semiconductor substrate.

Figure 4A:
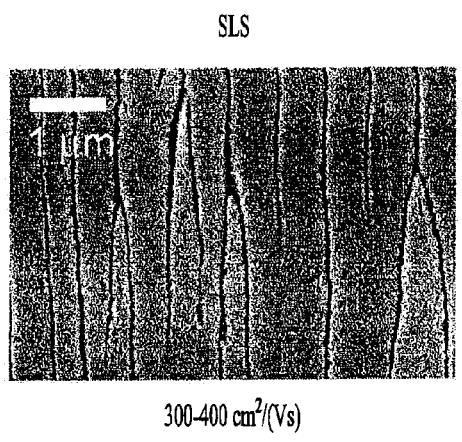
FIGS. 4A, 4B illustrate an example of a difference between a regular SLS structure (FIG. 4A) and a "2-shot" SLS structure (FIG. 4B).
Figure 4B:
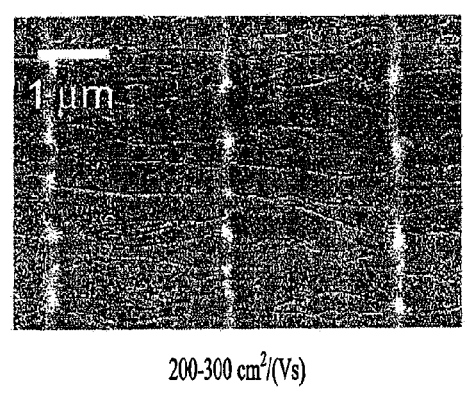

This SLS process can be modified into a cheaper, faster, and reliable "2-shot" SLS process, in an example. Unlike a directional SLS process that uses a laser beam providing a thin beam that is stepped along, which can involve several "shots" of light from the laser, a 2-shot SLS can use a pattern to cover a wide desired area, and the pattern can be stepped such that only two shots of the pattern can suffice to provide the desired polycrystalline grains. FIGS. 4A and 4B show an example of a difference between thin films to which the two processes are applied. The "2-shot" process, such as shown in FIG. 4B, can provide polysilicon grains that are more elongated, and therefore can provide a transistor with high-mobility and a low-threshold. Either SLS technique can be used to combine a direct band gap substrate with a thin film silicon device having an indirect band gap. The present inventors have recognized, among other things, that the above challenges in creating a silicon/non-silicon heterogeneous structure can be overcome, such as by using such SLS techniques, in an example. Such SLS techniques can overcome these challenges, such as by (1) limiting the thermal budget used to create active circuitry and (2) using the compound semiconductor as a substrate and building circuitry and interconnects using the same process as that used for the compound semiconductor substrate, in an example. The thermal budget can be limited, such as to be compatible with the underlying compound semiconductor substrate, such as by narrowing the laser pulse duration or its size in the SLS process, in an example. By using the compound semiconductor as a substrate and directly attaching an interconnect onto the compound semiconductor, in an example, the challenges associated with micromachining small devices can be avoided.

Figure 5:
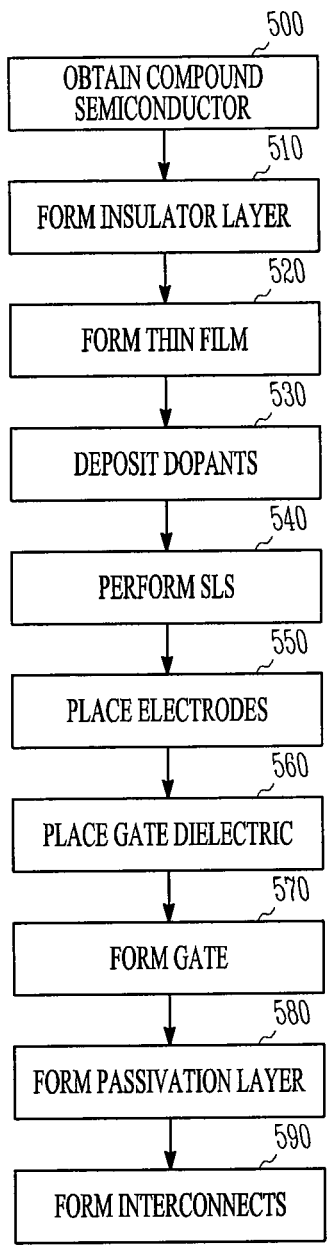
FIG. 5 illustrates an example of a process flow for combining a compound semiconductor with a thin film transistor.

FIG. 5 shows an example of a process flow for providing a silicon/non-silicon heterogeneous structure. At 500, a wafer or other substrate can be obtained or manufactured. The wafer or other substrate can have a substantially direct energy band gap, therefore allowing efficient light emission or absorption. Some examples of suitable substrate materials can include, by way of example, but not by way of limitation, one or more of GaAs, AlGaAs, AlGaP, AlGaInP, GaAsP, GaP, GaN, AlGaN, InGaN, SiC, ZnSe, C, AlN, AlGaN, AlGaInN, InAlP, InSb, InAlSb, HgCdTe, or a combination or alloy thereof.

At 510, in an example, an insulating layer can be formed on the first side of the substrate. Some examples of suitable insulating layer materials can include, by way of example, but not by way of limitation, one or more of parylene, polyimide, SiOx, SiNx, SiNOx, DLC, HfO, Al2O3, TaOx, RuOx, another insulating metal oxide, nitride, fluoride, chloride, polymer, or fluorocarbon material, or one or more combinations thereof. In an example, this insulating layer can serve as one or more of a thermal buffer, electrical insulator, passivation layer, or as an etch stop such as for a wet-etching or other etching process. At 520, in an example, a thin film can be formed on the device. In an example, the thin film can include a indirect bandgap semiconductor, such as silicon, that can be deposited or otherwise formed on the insulator overlying the compound semiconductor substrate. At 530, in an example, the thin film can be selectively doped, such as using ion implantation or by depositing one or more precursors onto the thin film. At 540, in an example, SLS can be performed on the thin film layer. The SLS can also activate the dopants into the re-crystallized thin film. The resulting structure can provide a doped source/drain region created by the merger of the dopants and the thin film. At 550, in an example, an electrode can be formed on the previously created source/drain region. At 560, in an example, a gate dielectric can be deposited or otherwise formed on the resulting structure. At 570, in an example, a FET or other transistor gate can be formed. At 580, in an example, a passivation layer can formed on top of the resulting thin film transistor device, such as to protect the resulting thin film transistor device. At 590, conductive vias and other interconnection structures can be formed, such as to electrically interconnect thin film transistor devices or to connect the thin film transistor devices to external circuitry or to the compound semiconductor substrate.

Figure 6:
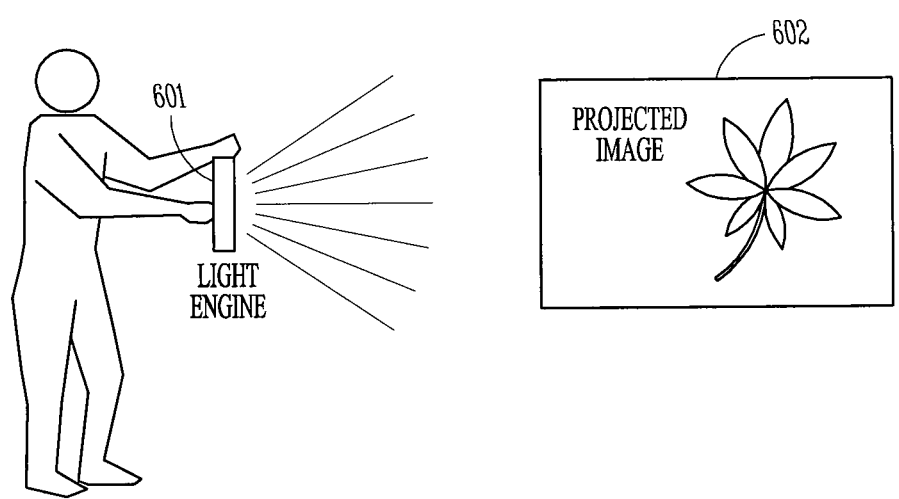
FIG. 6 illustrates an example of a light engine.

In a specific example, such a process can be used to create an active matrix LED array, such as for use with a light engine for a projection display. In certain examples, projection displays can provide a projected image that can be significantly larger than the electronics that generate it, such as illustrated in the example of FIG. 6. In the example of FIG. 6, a light engine 601 can be created, such as by using a thin film transistor device for providing a current for directly driving an efficient inorganic LED device in the corresponding direct band gap substrate. In this way, an active matrix array can be provided, such as to project a light onto a screen 602. Because an inorganic LED formed from a direct band gap substrate can provide a highly efficient luminous source, in an illustrative example, a potential projection of a 56 inch diagonal image can be obtained with an active matrix LED array integrated circuit chip that measures 36 millimeters diagonally.

Figure 7:
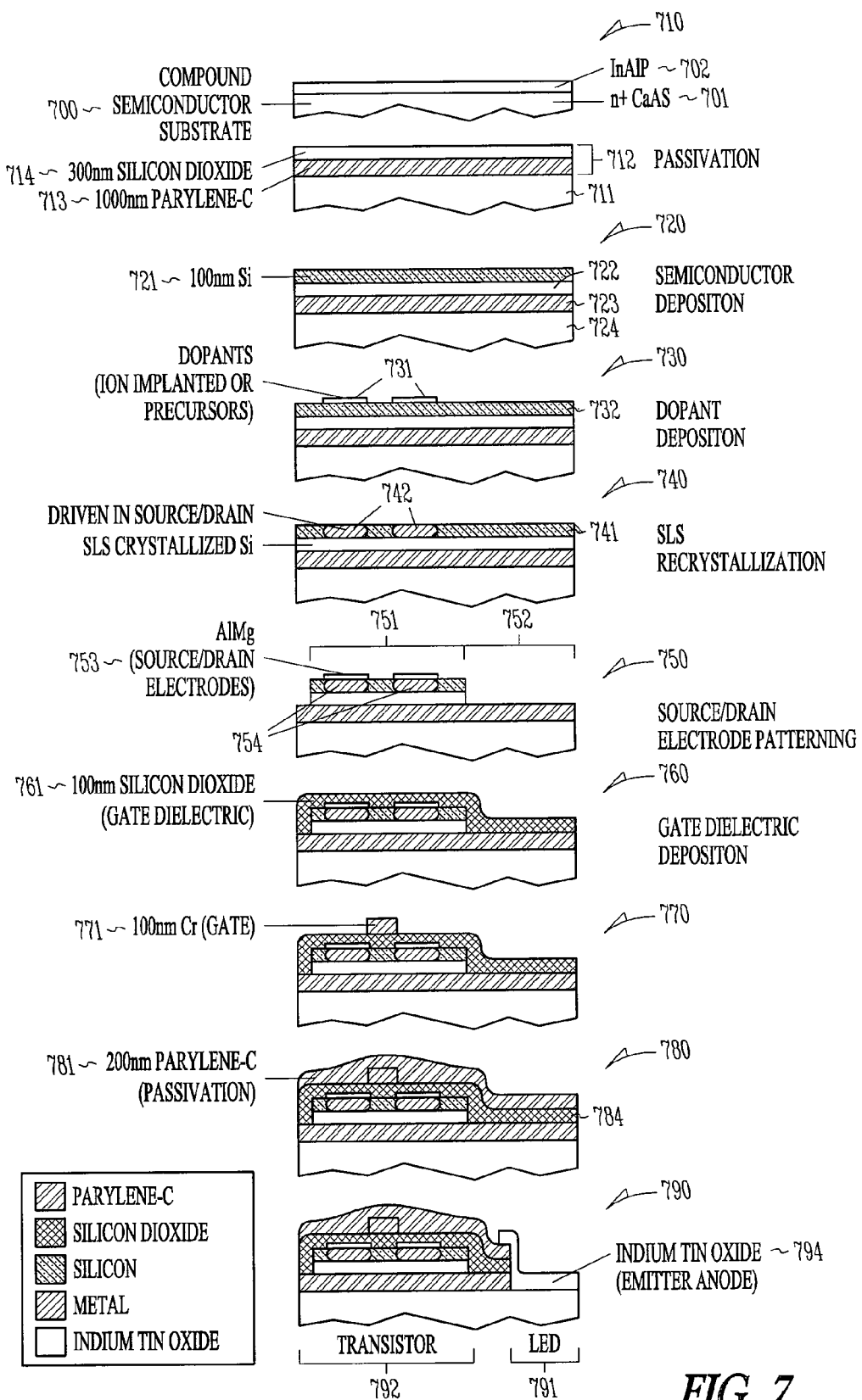
FIG. 7 illustrates an example of a cross-sectional view of an example of various stages in creating an example of an active matrix LED device.
Figure 8:
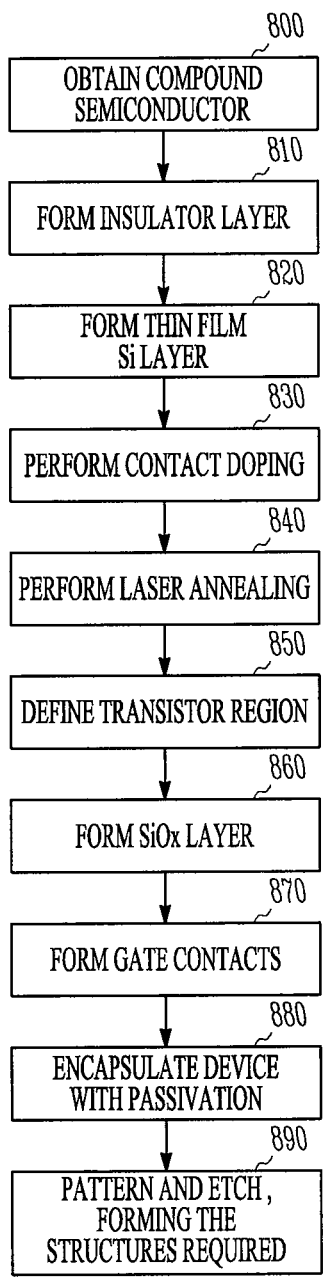
FIG. 8 illustrates an example of a process flow for creating an active matrix LED device.

FIG. 7 shows an example of a cross-sectional view of an example of an active matrix LED device, such as while undergoing fabrication, such as by the corresponding process shown in the example of FIG. 8, such as for creating such an active matrix LED device. At 800, in an example, a direct band gap substrate, such as a compound semiconductor substrate, can be obtained or manufactured. An example of a suitable material for the compound semiconductor is GaAs/InAlP. A GaAs/InAlP compound semiconductor substrate can be manufactured, in an example, by using a n+ GaAs 701 region of a starting substrate, and then depositing an InAlP 702 onto the n+ GaAs region 701. The heterostructure of GaAs/InAlP can emit light, such as at around the wavelength of 630 nanometers.

In addition, one or more mesas can be formed, such as to reduce or eliminate current spreading from the addressed pixel to other neighboring pixels. The mesas can be formed by etching the top layers of the LED stack down to an insulating layer underneath. The formation of mesas allows for the electrical isolation of the addressed pixel from its neighbors and prevents inadvertent biasing of unintended neighboring devices, such as when reverse-biasing is insufficient to turn unaddressed units off.

At 810, in an example, an insulating layer 712 can be formed upon the compound semiconductor substrate 711. In an example, the insulating layer 712 can include a layer thickness ranging from 50 nanometers to 10 micrometers of a chemical vapor deposition (CVD) deposited polymer material, such as parylene-C 713. In an example, parylene-C can be vapor deposited at room temperature, and can be resistant to many wet and plasma etching processes. The parylene-C layer 713 can serve as an electrical insulator, passivation, or as an etch stop for an etching process. In addition to parylene-C, in an example, the insulating layer 712 can include a silicon dioxide ($SiO_2$) layer 714, which can be deposited or otherwise formed, such as to add extra thermal buffering. Thermal buffering can help protect the compound semiconductor 711 from heat, such as heat generated during later SLS.

At 820, a thin film 721 of an indirect bandgap semiconductor, such as silicon (Si), can then be deposited or otherwise formed on the structure 710, such as by sputtering. In an example, the thin film Si layer 721 can be chosen for its compatibility with SLS. In an example, the thickness of the thin film Si layer 721 and the $SiO_2$ layer 722 can be chosen to protect the parylene-C layer 723 and compound semiconductor layer 724, such as from stresses caused during SLS laser crystallization. In an example, the thin film Si layer 721 can be a thickness within the range of 50 nanometers to 10 micrometers, and the SiO$_2$ layer 722 can be a thickness within the range of 50 nanometers to 10 micrometers. These thicknesses can be adjusted, such as to enhance the device performance or the overlayer protection.

At 830, in an example, active regions of the thin film Si layer 732 can be selectively doped, such as to provide conductively doped active regions 731 of the device. In an example, the active region doping can use ion implantation, such as by using a photoresist layer as a mask. Another technique can selectively apply one or more solid-phase dopant precursors, such as by using an additional layer of lithographically patterned CVD deposited silicon dioxide or silicon nitride as a doping mask. In either case, after doping, the doping mask can be removed, leaving a selectively doped active region. Some examples of other techniques of doping can include, by way of example, but not by way of limitation, one or more of engineering the source thin-film material, ion implantation, solid source doping, vapor phase doping, plasma doping, laser doping, printing, or one or more combinations thereof.

At 840, in an example, SLS laser annealing can be performed on the resulting structure 730. This can create an SLS crystallized thin film layer of silicon 741 with doped source/drain regions 742. The dopants can be activated and driven into the thin film Si layer 741, such as through the SLS laser annealing process. Examples of the SLS can include one or more of one-shot SLS, two-shot SLS, line SLS, sequential SLS, dot SLS, or the like, or one or more combinations or iterations thereof.

At 850, in an example, the resulting layers can be selectively etched down, such as to define the structures to create an active matrix LED transistor. In an example of the structure 750, a region can be mask-protected for the active matrix transistor 751 and a surrounding region can be etched down to the passivation layer for the LED 752. In an example, electrodes 753 can be deposited, or otherwise formed, and patterned, such as to connect to the doped regions 754 of the thin film semiconductor. In an example, Al/Mo can be used as a source/drain contact material for the electrodes 753.

At 860, in an example, a gate dielectric such as silicon dioxide 761 can be deposited onto or otherwise formed upon the structure 750. In an example, a thickness of 100 nm can be used for the silicon dioxide layer 761. The particular thickness can be adjusted, such as based on the process or other experimental data.

At 870, in an example, a gate contact 771 can be deposited onto or otherwise formed upon the structure 760. Various materials can be used for the gate contact 771. In an example the gate contact 771 can include a 100 nm chrome layer that can be deposited and patterned or otherwise fabricated such as to form a gate having a desired size.

At 880, in an example, an additional passivation layer 781 can be formed upon the structure 770 resulting in the structure 780. In an example, the passivation layer 781 can be formed with parylene-C and can be 200 nm thick. The passivation layer 781 can cover both the transistor region 782 and the LED region 783, in an example.

At 890, in an example, the structure 780 can be patterned and etched, which can result in the structure 790. In an example, the silicon dioxide layer 784 and the passivation layer 781 can be selectively etched over the LED region 791 of the structure in 790. This can expose the compound semiconductor 793 over the LED region 791. In an example, vias can be etched into the transistor region 792 of the structure 790. An anode layer, such as Indium Tin Oxide (e.g., ITO 90:10) 794 can be deposited or otherwise formed over the LED region 791, thereby forming an LED device 791. Indium Tin Oxide can be a good material for the anode of the LED 791 because it is a transparent conducting oxide. Therefore, it can form a transparent window (e.g., for light emission or detection) and it can be connected to the transistor region 792 using a conductive interconnect. Some other examples of suitable substantially transparent but electrically conducting materials, such as for use in providing such a "window," can include, by way of example, but not by way of limitation, one or more of: a doped metal oxide (e.g., ZnO, ZnAlO, SnO, CuO, or the like), a doped III-V compound, a doped II-VI compound, a doped group IV material, a thin noble metal, subwavelength stripes of metal conductors, a carbon nanotube composite, or one or more alloys or combinations thereof.

Figure 9:
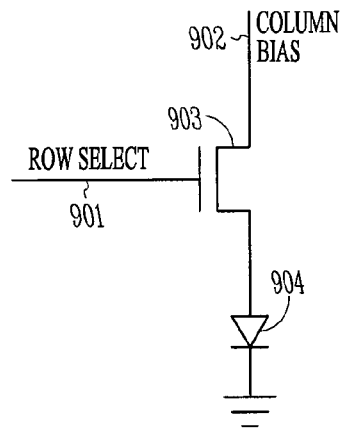
FIG. 9 is an example of a schematic diagram of an active matrix LED device.

FIG. 9 is a circuit schematic illustrating an example of how the resulting structure 790 can serve as a highly effective active matrix LED. In the example of FIG. 9, a row select 901 can control the gate of the thin film Si transistor 903. A dolumn bias 902 can be connected to the drain of the thin film Si transistor 903, thereby driving the LED device 904, which can be connected to the source of the thin film Si transistor 903. In an example, the LEDs can be arranged in an array, and particular LEDs can be addressed by thin film Si transistors. In an example of an array, if the row select 901 is asserted, and the column bias 902 is charged, the LED device 904 becomes electroluminescent.

In an illustrative example of the active matrix LED device described above, the LED can be 200×200 μm$^2$, and the transistor width and length can be 200×10 μm$^2$, respectively. In an illustrative conceptual example, the saturation current of the NMOS transistor, with a mobility of 300 cm$^2$/V, and a gate drive voltage of $(V_{gs}-V_T)$=5V, can be 3 mA (delivering approximately 7.5 A/cm$^2$ to the LED). In an illustrative conceptual example, for a GaAs/InAlP device, a current of 3 milliamps can be adequate to drive a 200×200 μm$^2$ LED at 14 millicandela in the emissive area. This can correspond to a brightness of 350 kilocandela per meter squared at the source. A typical display can be projected at 100 candela per meter squared. Therefore, a device as described, assuming a loss factor of 2 due to the optics and screen, can provide a magnification on the order of 1750. With this magnification, a 1024×758 pixel light engine with this pixel size (200×200 μm$^2$ of active area and 300×300 μm$^2$ pixelpitch), at the source can be approximately 30×20 mm$^2$ overall and can project an image on the order of 1200×800 mm$^2$ (approximately 56 inches along the diagonal).

The above example describes an active matrix array, which can include single thin film Si transistor LED elements. In other examples, different circuitry can be used to create an advanced active matrix array. In a typical active matrix array, the pixel is active during the row select time, leaving the duty cycle for an n row display to be 1/n. An advanced active matrix array can avoid this by adding extra transistors that allow an LED to be charged for an extended time, increasing the brightness of the light engine.

Figure 10:
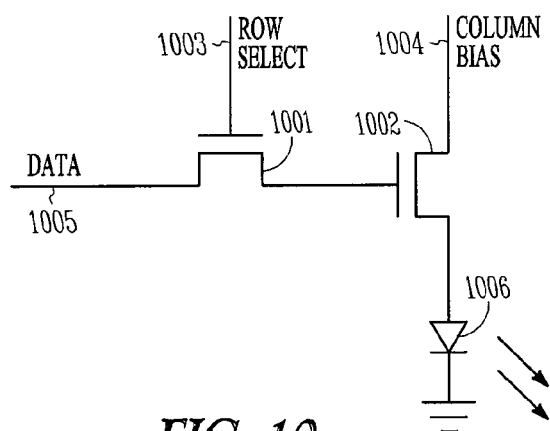
FIG. 10 is an example of a schematic diagram of an example of an advanced active matrix LED device.

FIG. 10 shows such an example, in which an extra transistor 1001 can be added to drive the gate 1006 of the transistor 1002 that controls the current driving the LED 1006 from the column bias 1004. When row select 1003 is asserted, a data value 1005 can be latched in, which in turn drives the column bias. Therefore, in this example, a current can still drive the LED even when the applicable row select 1003 is no longer asserted. In a circuit such as this, it can be more challenging to control the drive current on the LED due to the fact that the current/voltage relationship is a square law and depends on the threshold voltage of the device 1002, which may be process-dependent.

Figure 11:
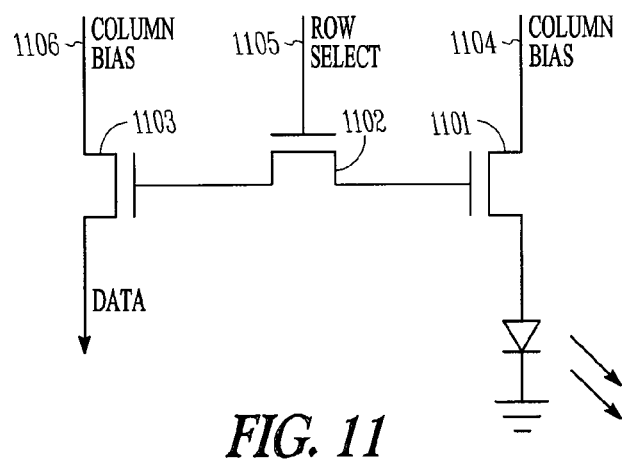
FIG. 11 is an example of a schematic diagram of an example of an advanced active matrix LED device.

FIG. 11 presents an example of another version of an advanced matrix LED array. In the example of FIG. 11, the transistor 1101 is mirrored through transistor 1103. This can offer more controlled LED driving currents. In laying out the thin film Si transistors, to increase transconductance and optical matching, it can be helpful to line up the SLS grains for the transistors used in the current mirror and its accompanying LED driver.

The above example emphasizes a monochrome projection unit. However, the technology described herein can also be used for multicolor projection. For example, three color projection can be achieved by combining the light from three units, such as in a beam splitter configuration. Such a configuration can retain certain features, such as avoiding requiring a color wheel or a color filter, and can provide for a long lifetime. Such a projection unit such can avoid requiring the spatial light modulators associated with typical digital light processors (DLP) micromirror arrays, polycrystalline-Si based LCD panels, or liquid crystal on silicon (LCOS) devices. Therefore, these advantages can lead to a significant enhancement of system and energy efficiency, while reducing the complexity of the optical subsystem, and improving the overall form factor.

Such an architecture can also be combined with a photonic crystal, which can lead to a superior performance of an optical system. Much of the light produced in an LED is wave guided in the material or emitted at angles which are not necessarily captured by the projection optics. Using a photonic crystal over layers can manage the light emission cone and increase the useful light output for the optical system. In an example, the phonic crystal can include a crystal structure that has been etched into a lattice or other desired pattern, such as to help guide the light in a desired direction.

The previous examples emphasize how the devices described can exploit the light emitting aspects of a compound semiconductor. In an example, the light emitting areas of the compound semiconductor can additionally or alternatively be used as a photodetector matrix ("photomatrix"). The photomatrix can be achieved by fabricating thin film semiconductor readout circuitry onto compound semiconductor photodetector structures. As with active matrix LED arrays, this can reduce or avoid many of the issues associated with wafer-bonded devices.

In general, many different hybrid compound/thin film semiconductor structures can be envisioned with the technology described herein. Some illustrative examples of devices that can benefit from the placement of active circuitry on thermally sensitive active substrates include: hybrid silicon logic/high speed or high power compound semiconductor devices, MEMS systems (e.g., instrumenting an accelerometer machined out of a non-silicon material), microfluidic systems (e.g., adding local amplifications to a flow sensor), microreactors (e.g., measuring and regulating temperature in a hydrogen reformer) and piezoelectric systems (e.g., making an active matrix piezoelectric device without de-poling the substrate).

II. Example of a Directly-Addressed Monolithic LED Array as a Projection Source

Monolithically patterned LED arrays can be demonstrated in several applications, examples of which can include microdisplays, fluorescence detection, directly powered high voltage AC solid state lighting, or mask-free lithography. LED arrays can be fabricated and demonstrated in the visible and ultraviolet wavelengths, for example (but not by way of limitation) in form factors up to 64×64 pixels in a passively addressed scheme, and up to 32×32 pixels in a flip-chip bonded actively-addressed example. In an example, a representative blue LED array device can exhibit a maximum power-density of 43 W/cm$^2$ at a current density of 4000 A/cm$^2$.

With power densities in this range, a high quality projection display using a monolithically integrated LED array as the source can be provided. In an approach, a modern projection system can have three parts: (1) a light source, (2) a spatial light modulator (SLM), and (3) a system of one or more projection lenses. The spatial light modulator can be used to reject light from regions of the image that are intended to be dark, thereby structuring the light into the desired pattern. This light rejection can reduce the overall system efficiency, because the light source operates at full intensity at all times, regardless of the particular image being projected. In a larger projector, the light source can be a high intensity discharge (HID) lamp, which can provide the high illuminance desired. HID lamps can also be used in smaller projectors. Improvements in LED brightness and efficiency can allow the use of three high power LEDs as the light source. The higher efficiency, smaller size, and sequential color selectivity of LEDs can be used to provide more efficient smaller projectors and pico-projectors. A liquid crystal display, micromirror array, or liquid-crystal-on-silicon engine can provide the desired light modulation, and can either transmit or reject light for a given pixel. The varying degrees of light blocking and time modulation can allow for grayscale and can also define the contrast ratio. In an example, the modulated light can then be projected through a series of lenses, such as to re-image the SLM onto a screen.

An example of another approach, which can provide an alternative to a SLM designs, can use of a structured LED array as a projection source. In an example, such an array can integrate the light source and light modulator into a single component, which can help make the system cheaper and easier to use. In such an example, photons need only be generated when needed as part of the image, thereby improving efficiency by eliminating unneeded light that would otherwise lost in the SLM. Using LEDs can improve efficiency even further, such as by eliminating the need for color filters, which can reject two-thirds of the generated light. In an example, an approach can use a thin film silicon/compound semiconductor LED array structure, such as described elsewhere in this document, as a projection light source. In an example, an approach can use organic LED (OLED) displays as a projection light source. Using an OLED display can offer many of the same advantages as micro-LED arrays, such as providing increased contrast and higher system efficiency. Also, organic LED systems have a unique ability to display full color on one substrate. However, their luminous efficiencies and peak brightness can be lower than inorganic LEDs, and thus inorganic LEDs can offer a brighter and larger image, in certain examples.

DESIGN EXAMPLE

The present inventors have recognized, among other things, that advances in heatsinking and device design can permit the development of large area, high drive power LEDs capable of both high brightness and high luminance. Assuming typical drive values achievable on a Cree XLamp LED, a current density of 35 A/cm$^2$ and 17.2 cd in the 980×980 micrometer emissive area corresponds to a brightness of 17,000,000 cd/m$^2$ at the source. In a conceptual example, a display can be projected at 100 cd/m$^2$, assuming a combined factor of 10 loss in the optics and screen, a linear magnification of 130 times can be possible. In a conceptual example, a 1024×768 light engine with a pixel size of 10 μm×10 μm active area and 15 μm×15 μm pixel pitch will be approximately 15 mm×11 mm overall and can project an image on the order of 1300 mm×1000 mm (e.g., about 65 inches diagonal) at the 100 cd/m$^2$ display brightness.

This document describes, among other things, examples of a directly-addressed monolithically integrated LED array that can provide an optical power density of 0.69 W/cm$^2$ capable of projecting an image with 100,000 cd/m$^2$ through a 10× microscope objective. It further discusses using LED arrays for projection and examples for making full color projectors from three LED arrays. Unlike an active matrix LED array, in which the LEDs can be accompanied by corresponding drive transistors for actively driving the LEDs, a directly-addressed or direct-drive LED array can operate as a passive matrix that can use the non-linear diode characteristic to turn on LEDs, such as by using a conductive grid to drive the LEDs. External switches can provide addressing of particular LEDs, as desired.

LED Fabrication Example

In an example, the individual LED pixels were fabricated on a commercially obtained GaAs wafer from Bandwidth Semiconductor with the epitaxially grown layers such as shown in Table I.

TABLE I

LED Layered Structure Example

| Layer (listed in order from top to bottom) | Thickness (nm) | Type and Concentration (cm$^{-3}$) |
|---|---|---|
| GaAs | 100 | N+, 10$^{19}$ |
| Al$_{0.4}$GaAs | 700 | N, 10$^{18}$ |
| Al$_{0.3}$GaAs | 100 | Undoped |
| Al$_{0.4}$GaAs | 2500 | P, 10$^{18}$ |
| GaAs | 100 | P+, 10$^{19}$ |
| AlAs | 1500 | Undoped |
| GaAs | Substrate | N + 10$^{18}$ |

In an example, a semi-insulating AlAs layer of 1500 nm can be grown on a 10$^{18}$ cm$^{-3}$ n-doped GaAs wafer. Next, a 100 nm p+ GaAs layer can be grown, such as to serve as a current spreading layer for the LED stack. In an example, the next layer, e.g., of 2500 nm 10$^{18}$ cm$^{-3}$ p-type doped AlGaAs, can serve as the p-confinement and p-contact. In an example, this p-type AlGaAs layer can have ample thickness, such as enough thickness to allow for process tolerances when etching the mesa structure to define the LED. In an example, the n-confinement can be provided by the 700 nm of 10$^{18}$ cm$^{-3}$ n-type AlGaAs layer, which can be above the undoped AlGaAs active layer. A 100 nm n+ GaAs layer can provide the current spreading desired, and can provide a good ohmic contact, such as to one or more subsequent metal depositions.

Figure 12A:
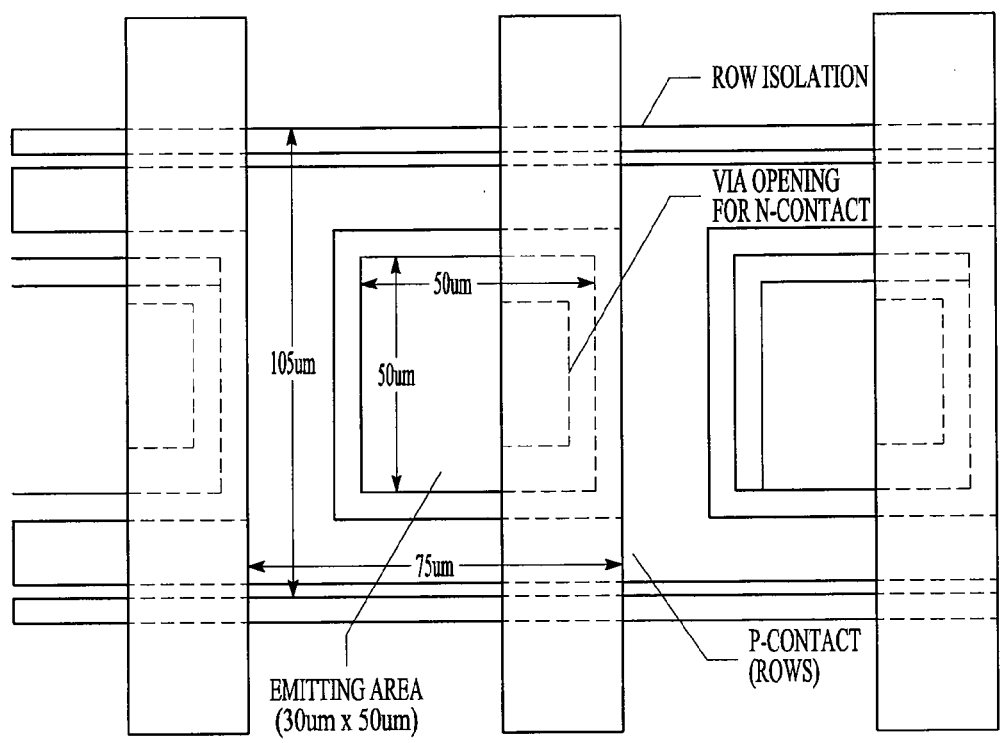
FIG. 12A shows an example of a top view of an LED pixel. In an example, the emitting area can be 30 µm×50 µm in a pixel that can be 75 µm×105 µm, which gives a fill factor of 19%.
Figure 12B:
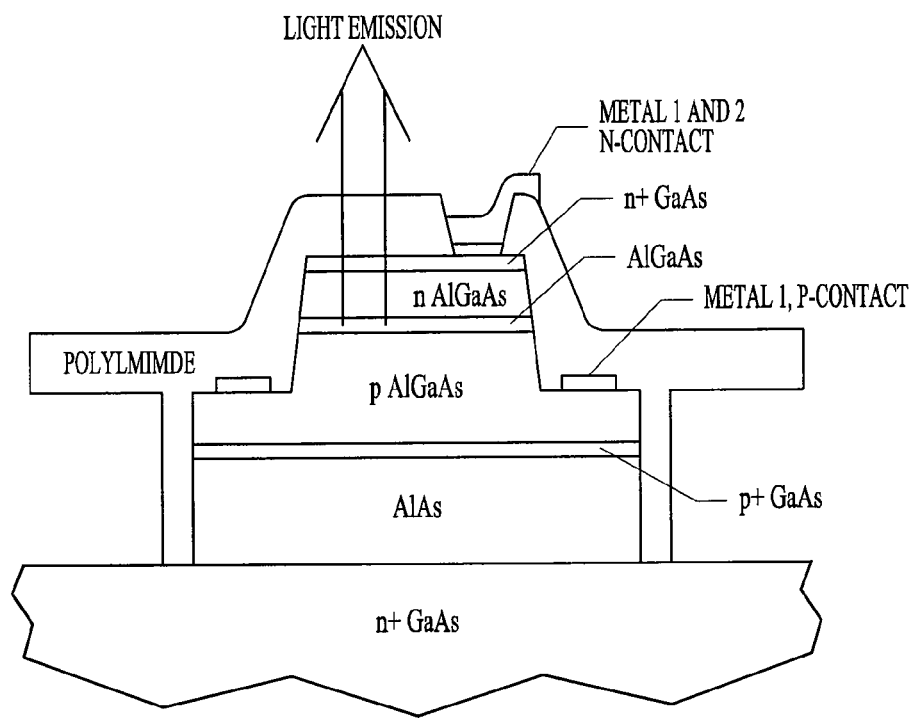
FIG. 12B shows an example of a cross-sectional side view of the LED pixel, showing an example of the epitaxial stack and processed films.

In an example, the fabrication was performed using a five mask process, an example of the top and cross section views are shown in FIG. 12A and FIG. 12B, respectively. The first mask pattern (Etch 1) can be used to define the mesa etch areas, which can then be etched such as with a 12:1 citric acid to a 30% hydrogen peroxide solution, in an example. In an example, the etch solution was prepared by dissolving 12 g of citric acid monohydrate into 12 mL of deionized water over two hours on a hotplate held at 25 degrees C. Since the dissolution of citric acid monohydrate into water is an endothermic reaction, the use of a hotplate at a temperature slightly above room temperature can speed up the process and help limit process variation. The hydrogen peroxide can be mixed into the citric acid solution, such as 15 minutes before the etching of the patterned wafer. In an example, a layer of 50 nm Cr/500 nm Au (Metal 1) was thermally evaporated and patterned with a standard lift-off process to define both the n and p contacts. In an example, the p-contact can be on the bottom of the mesa and can also define the rows. In an example, the n-contact can be on the top of the mesa and can also be patterned in this step, such as to allow for testing of individual devices. In an example, a second etch step (Etch 2) can cut a trench between each row, such as by using the same citric acid and hydrogen peroxide chemistry as the first mesa etch. In an example, a layer of photo-imageable polyimide (e.g., HD Microsystems 8820) can then be spun and patterned, such as by using a contact lithography system to open the via and contact pads. In an example, the polyimide can be cured in a nitrogen environment, such as on a hotplate at 350 degrees C. for 1.5 hours. In an example, this layer can define the via contact holes to the n-contact of each device. In an example, another layer of 10 nm Cr/100 nm Au (Metal 2) can be thermally evaporated and patterned to form the column lines.

In an example, such devices can then be connected, such as wire-bonded to a dual in-line package, such as for ease of measurement, and coated with parylene or another polymer layer, such as to help protect and strengthen the wirebonds. In an example, the dimensions of the LED array can be conservatively designed. In an illustrative example (but not by way of limitation), each pixel is 50 μm×50 μm, and the metal square surrounding the mesa is the p contact and has a width of 15 μm. In an illustrative example, the rectangular n contact is 15 μm×30 μm and the via holes and column lines are patterned on top of that area. In an example, the center-to-center pitch dimension is 75 μm in the rows and 105 μm in the columns. This corresponds to a fill factor of 19%. These numbers can be improved, such as by using a higher resolution lithography system and less conservative pixel design. An additional consideration can involve the material underneath the wirebond pad. In an example, to ensure that wirebonds adhere to the pad, the polyimide underneath the pad can be removed. In an example, in order to isolate adjacent contacts electrically, a mesa structure can be formed for each of the pads during the first etch such as in conjunction with patterning the devices. In an example, the final wirebond pad structure can be Cr/Au (Metal 1) on n+ GaAs, followed by a second layer of Cr/Au (Metal 2).

LED Characterization Example

In an example, the following measurements were performed on a column of devices having ten individual pixels. In an example, each column can be addressed as one element because of crosstalk through the semi-insulating AlAs layer and the conductive GaAs substrate. In an experimental example, the perimeter of the bond pads light up as well, showing the severity of the crosstalk. In an example, we can directly-address each of the ten columns individually.

In an example, all electrical measurements were taken using an Agilent U2722A source measure unit. In an example, optical power was measured with a calibrated Newport 818-UV silicon photodetector approximately 2 mm from the device.

Figure 13:
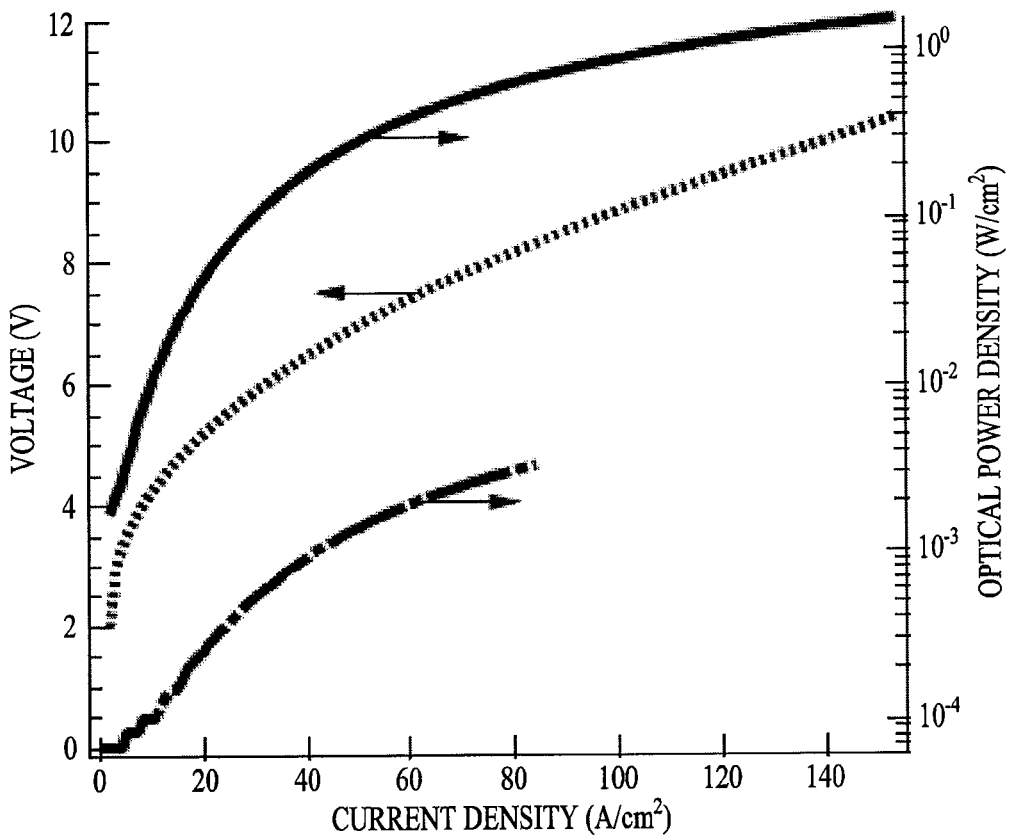
FIG. 13 is a graph showing an example of power-voltage-current characteristics of a column of (e.g., 10) devices. The arrows point toward respective axes. The solid line represents the optical power density at the source and the dashed line represents the optical power density projected through a microscope objective.

FIG. 13 shows an example of a typical power-current-voltage curve for one column of devices. In an example, the current-voltage characteristics show a typical turn-on voltage around 5.5V at a current of 8 mA. In an example, the optical power-current characteristics are nearly linear after 40 A/cm$^2$ with each column driven as high as 150 A/cm². In an example, a corresponding optical power density at the maximum current density is 1.5 W/cm² and the source brightness at this current density is 45,700,000 cd/m². In an example, the maximum current density can be limited by the resistivity of the metal lines. In an example, the heat generated from the series resistances could eventually cause the column of devices to fail before reaching the limits of individual LEDs.

In an example, the spectral characteristics of an LED pixel can be taken with an Ocean Optics USB4000 spectrometer. In an example, the undoped AlGaAs active region has a peak emission wavelength at 702 nm with a full width half max of 18 nm. In an example, this spectral output is a highly saturated red and has 1931 CIE coordinates of x=0.71, y=0.29. In an example, secondary peaks at 660 nm and 890 nm do not have a noticeable effect on color point. In an example, without being bound by theory, these minor peaks can be attributed to direct band-to-band recombination of GaAs and the other AlGaAs materials.

Projection Methods Examples

Figure 14:
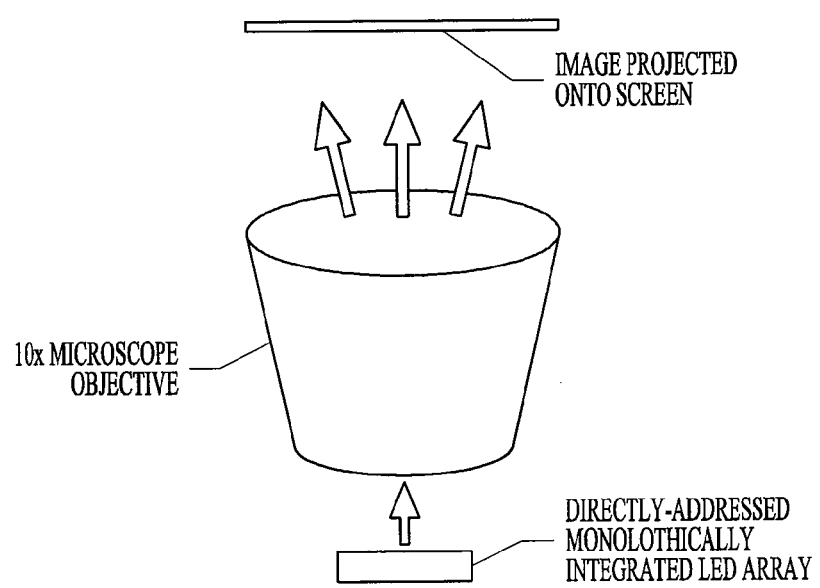
FIG. 14 shows an example of a proof-of-principle projection setup, such as with LED array in-line with a 10× microscope objective.

In an example of a proof-of-principle projection setup, a column of devices was measured using a standard 10× microscope objective, such as shown in the example of FIG. 14. In an example, the projected power, such as shown in the example of FIG. 13, was measured using a calibrated Newport 818-UV silicon photodetector held six inches from the source. In an example, at a current density of 84 A/cm², the source brightness is 21,000,000 cd/m², and the projected brightness is 100,000 cd/m². In an example, the overall system magnification is approximately 5×, which accounts for a factor of 25 decrease in brightness per unit area. In an example, the remaining 8.4× loss in brightness is believed due to the poor coupling between the device and optics, as well as a relatively high working distance of the microscope objective.

Figure 15A:
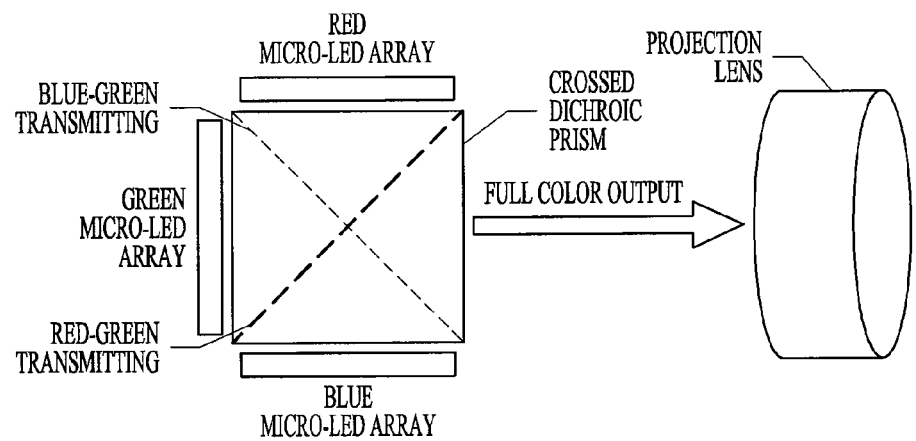
FIGS. 15A and 15B show examples of two full color projection schemes, such as using beam splitters, including a dichroic cube configuration example and standard dichroic filters.
Figure 15B:
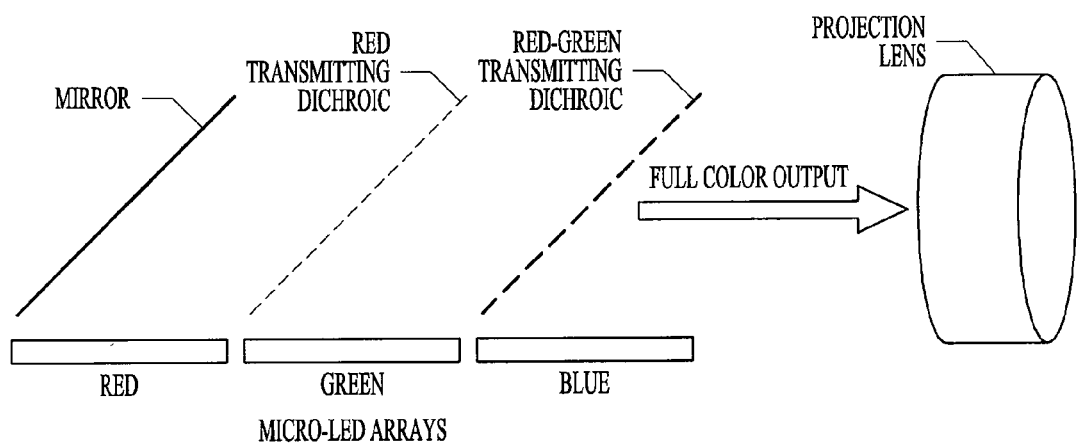

In an example, a more complex optical setup can be used, such as for full color projection. In an example, such setups can include methods used by 3LCD and LCoS projection technologies. FIGS. 15A, 15B show two examples of using three monolithically integrated LED arrays. The first example, shown in FIG. 15A, can use a crossed dichroic prism with the RGB LED arrays on three of the four sides. In this example, the beam can be combined in the dichroic cube and then projected through lenses in the front. This example of a system can be made into a small overall volume, but because the LED arrays are on separate planes, three flex bonds are used to connect the LED arrays to control circuitry. Also, as LEDs are driven to higher brightnesses, more heat-sinking can be used to prevent degradation. In this setup, each micro-LED array can use its own heatsink, which can add to the overall size.

The second example, shown in FIG. 15B, can use one mirror and two dichroic filters as beam combiners. In this example, the combined RGB LED beam can then be projected through a standard projection lens. With this more linear scheme, one heatsink can remove heat from all three LED arrays concurrently, and all of the arrays can be connected to a single control board, if desired.

In both of these examples of structures, the dichroic filters can transmit 90% to 100% of the desired light and can reflect nearly 100% of the undesired light. With these efficient optical systems, most of the light emitted from the LED array can be captured and projected onto the screen. Also of interest in both these systems is the relative alignment of each LED array. The convergence of RGB pixels is needed along all six-axes (x, y, z, θ, φ, ψ).

Conclusion

In certain examples in this document, a directly-addressed monolithically integrated LED array was demonstrated such as for a monochrome projector. At a current density of 84 A/cm² and an optical power density of 0.69 W/cm² at the source, we can achieve a project brightness of 100,000 cd/m² on a screen six inches away using a microscope objective. Micro-LED arrays can be demonstrated up to 43 W/cm² at the source. Using higher power devices and improved coupling from the source to the optics, a brightness of 100,000,000 cd/m² is believed possible, allowing the formation of large screen image sizes directly from an emissive light source. Full color projectors using three micro-LED arrays can be realized using currently available projector optics and this architecture platform.

III. Examples Using a Phosphor to Allow Full-Color From Single Monolithic LED Array Projection Source To recap, the previous examples have described, among other things: how to integrate thin film indirect bandgap semiconductor circuitry with a compound semiconductor LED array, such as to provide addressing for a light source that can provide a high intensity suitable for use in a light projector; how to provide a directly-addressable compound semiconductor LED, such as for use in an LED array to provide a high light intensity suitable for use in a light projector; how to combine light from multiple (e.g., three) monolithic integrated circuit chip LED array light sources, such as for use in a high intensity light projection application.

The present inventors have also recognized, among other things, that in some projector or applications, high brightness is not required. For example, direct view display applications such as microdisplays or near-eye displays (e.g., a display that can be integrated into eyeglasses or goggles) only need between about 50-100 cd/m² over a small area. For a state-of-the-art picoprojector (e.g., a light projector that can be integrated with a mobile phone), the brightness needed is in the range of about 10-20 lumens. Even assuming a 20% fill factor, an LED chip such as described above (e.g., assuming 17,000,000 cd/m² source brightness) can produce the same amount of light using approximately 1 mm×1 mm of active chip area for the LED array.

In an example, a phosphor can be formed in the light emission path from an individual LED in the LED array, such as to pass light of a specified color in response to light from and at the characteristic wavelength of the LED. In an example, a pixel in the array can be made up of sub-pixels with different phosphors that respectively contribute different colors to the overall color of the pixel. By making the sub-pixels separately addressable, such that the light intensity of each sub-pixel can be adjusted, the respective contributions of the sub-pixel can be adjusted to provide the desired overall color of the pixel. In an example, a pixel can include three sub-pixels with respective phosphors that respectively pass Red, Green, and Blue light that can combine to provide the overall light from the pixel at the desired color. In an example, the pixel can include four sub-pixels with respective phosphors that respectively pass Red, Green, Blue, and Green light that can combine to provide the overall light from the pixel at the desired color. In an example, the pixel can include four sub-pixels with respective phosphors that respectively pass Red, Green, Blue, and White light that can combine to provide the overall light from the pixel at the desired color. In an example, the sub-pixel can be provided thin-film indirect bandgap semiconductor addressing circuitry, such as described above for a pixel, such as with respect to FIGS. 9-11; stated differently, the earlier described pixel-addressing can be used to perform sub-pixel addressing in the present context, with a controller circuit providing addressing signals to the sub-pixels to adjust their relative intensities to provide the desired color of a composite "pixel" to which the sub-pixels contribute. This can allow a single monolithic LED array to be used as a projector light source to provide full-color light projection, instead of the three separate monolithic LED arrays described above with respect to certain examples.

In an example, the phosphor can be selectively formed at the desired locations (e.g., defining "windows" in association with particular sub-pixels, through which light from the sub-pixel can pass and be downshifted to longer wavelengths by the phosphor). In an example, this can include incorporating the desired phosphor in a light-activated cross-linkable carrier medium, such as polyvinyl alcohol, which can be photo-lithographically selectively exposed to light to keep the desired phosphor and the desired locations of interest (e.g., in the light path of the particular sub-pixels to be associated with the particular phosphor), with the unexposed remainder of the carrier medium being washed away. This process can be repeated for different phosphors to provide the different colors in association with the desired particular sub-pixels.

In illustrative examples, the phosphors can include, by way of example, but not by way of limitation:

Red:
  $Y_2O_3:Eu_{3+}$
  $(Y,Gd)BO_3:Eu_{3+}$
  $Y_{0.96}P_{0.60}V_{0.40}O_4:Eu_{0.04}$

Green:
  $BaAl_{12}O_{19}:Mn_{2+}$
  $(Ba,Sr,Mg)O_xAl_2O_3:Mu_{2+}$
  $Zn_2SiO_4: Mn_{2+}$ Blue:
  $BaMgAl_{10}O_{17}: Eu_{2+}$
  $YP_{0.85}V_{0.15}O_4$
  $ZnS:Ag$ In most of these examples, the first material can be a wide bandgap semiconductor (e.g., yttrium oxide or ZnS) with a dopant (e.g., europium or Ag). The dopant can be called an activator in this circumstance. A few materials have luminescent vacancies (usually oxygen) and do not need to be doped with anything else.

Additional Notes

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown and described. However, the present inventors also contemplate examples in which only those elements shown and described are provided.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The claimed invention is:

1. A method comprising:
  providing an inorganic substrate with a substantially direct bandgap for light emission or absorption;
  forming an insulating layer on a first side of the substrate;
  forming an indirect bandgap semiconductor layer on the insulating layer;
  selectively melting and crystallizing an active region of the indirect bandgap semiconductor layer formed on the insulating layer;
  forming an electrical contact to the crystallized active region in the indirect bandgap semiconductor layer;
  forming an electrical contact to the substrate; and
  forming a window to the substrate, wherein the window is substantially transparent to light at a wavelength emitted or absorbed by the substantially direct bandgap of the substrate.

2. The method of claim 1, comprising:
  forming a thin film semiconductor transistor in the active region;
  wherein forming an electrical contact to the crystallized active region in the indirect bandgap semiconductor layer comprises forming electrodes contacting the thin film semiconductor transistor;
  forming an insulating layer over the thin film semiconductor transistor;
  forming vias in the insulating layer over the thin film semiconductor transistor; and
  wherein forming a window to the substrate comprises forming a transparent conductor contact to a light emitting or light absorbing area of the substrate.

3. The method of claim 1, wherein providing the substrate comprises providing a compound semiconductor substrate comprising at least one of GaAs, AlGaAs, AlGaP, AlGaInP, GaAsP, GaP, GaN, AlGaN, InGaN, SiC, ZnSe, AlN, AlGaN, AlGaInN, C, InAlP, InSb, InAlSb, or HgCdTe.

4. The method of claim 1, wherein selectively melting and crystallizing an active region comprises performing at least one of excimer laser crystallization, sequential lateral solidification, two-shot sequential lateral solidification, line sequential lateral solidification, or dot sequential later solidification.

5. The method of claim 1, comprising:
  forming a gate insulator on the selectively melted and crystallized active region of the silicon layer;
  forming a gate on the gate insulator; and
  forming an insulating layer over active region, the insulating layer comprising at least one of parylene, polyimide, SiOx, SiNx, SiNOx, DLC, HfO, $Al_2O_3$, TaOx, RuOx, metal oxide, nitride, fluoride, chloride, polymer, or fluorocarbon.

6. The method of claim 1, comprising:
providing a phosphor, in or aligned with the window, the phosphor configured to pass a specified color of light in response to light at a wavelength emitted by the substantially direct bandgap of the substrate.

7. The method of claim 2, wherein forming a transparent conductor contact comprises using at least one of ITO, ZnO, AZO, GZO, SnO, Au, Pt, Pd, CuO, TiO, RuO, InCdO, Ag, CdO, TiN, or a noble metal.

8. An apparatus comprising:
an inorganic light emitting or absorbing device formed from an inorganic substrate providing a substantially direct bandgap for light emission or absorption;
an insulating layer on a first side of the substrate;
an indirect bandgap semiconductor layer on the insulating layer;
a thin film semiconductor circuit, in the indirect bandgap semiconductor layer, the semiconductor circuit comprising a selectively melted and crystallized polycrystalline grain semiconductor active region;
an electrical connection, through the insulating layer, electrically connecting the inorganic light emitting or absorbing device with the thin film semiconductor circuit; and
a window to the substrate, wherein the window is substantially transparent to light at a wavelength emitted or absorbed by the substantially direct bandgap of the substrate.

9. The apparatus of claim 8, wherein the inorganic light emitting or absorbing device comprises an inorganic light emitting diode (LED) formed in the substrate, the LED comprising:
an n+ GaAs cathode region of the substrate; and
an InAlP anode region of the substrate; and
wherein the apparatus comprises a plurality of the LEDs arranged in an active matrix array.

10. The apparatus of claim 8, comprising:
a phosphor, in or aligned with the window, the phosphor configured to pass a specified color of light in response to light at a wavelength emitted by the substantially direct bandgap of the substrate.

11. The apparatus of claim 8, comprising pixels, an individual pixel including a plurality of sub-pixels, an individual sub-pixel including a phosphor that is configured to receive light from an inorganic LED in the substrate and to pass a specified color of light in response to the received light, and wherein the individual sub-pixels individually contribute respective colors to an overall color of light provided by the individual pixel.

12. The apparatus of claim 8, comprising a light projector or a direct-view display comprising the pixels, and wherein the pixels are monolithically integrated with the substrate.

13. The apparatus of claim 8, comprising a light projector comprising the pixels, and wherein the pixels are configured to provide a directly addressed monolithic LED array light projection source configured to provide both a light source and a light modulator in the same component.

14. An apparatus comprising:
a light projector or a direct-view display, comprising:
a direct drive monolithic LED array light source configured to provide both a light source and a light modulator in the same component.

15. The apparatus of claim 14, comprising a light projector including the direct drive monolithic LED array light source and comprising:
a projection lens, arranged to receive light from the light source.

16. The apparatus of claim 14, wherein the light source comprises:
a direct drive red monolithic LED array light source;
a direct drive green monolithic LED array light source; and
a direct drive blue monolithic LED array light source.

17. The apparatus of claim 14, wherein the direct drive monolithic LED array light source is configured to be capable of passive matrix operation.

18. The apparatus of claim 14, wherein the direct drive monolithic LED array light source is configured to be capable of direct addressing operation.

19. The apparatus of claim 14, comprising pixels, an individual pixel including a plurality of subpixels, an individual sub-pixel including a phosphor that is configured to receive light from an inorganic LED from an inorganic substrate and to pass a specified color of light in response to the received light, and wherein the individual sub-pixels individually contribute respective colors to an overall color of light provided by the individual pixel.

20. The apparatus of claim 16, comprising a light mixer, arranged to mix light from the red, green, and blue direct drive monolithic LED array light sources for providing to a projection lens.

21. The apparatus of claim 20, wherein the light mixer comprises a crossed dichroic.

22. The apparatus of claim 20, wherein the light mixer comprises a mirror, a red transmitting dichroic, and a red and green transmitting dichroic.

* * * * *